(12) United States Patent
Qu et al.

(10) Patent No.: US 10,556,787 B2
(45) Date of Patent: Feb. 11, 2020

(54) LIQUID TRANSFER APPARATUS AND CONTROL METHOD THEREOF

(71) Applicants: BOE Technology Group Co., Ltd., Beijing (CN); Hefei Xinsheng Optoelectronics Technology Co., Ltd., Hefei (CN)

(72) Inventors: Litao Qu, Beijing (CN); Xuequan Jin, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 203 days.

(21) Appl. No.: 15/560,623

(22) PCT Filed: Jun. 1, 2017

(86) PCT No.: PCT/CN2017/086878
§ 371 (c)(1),
(2) Date: Sep. 22, 2017

(87) PCT Pub. No.: WO2018/001035
PCT Pub. Date: Jan. 4, 2018

(65) Prior Publication Data
US 2018/0251363 A1   Sep. 6, 2018

(30) Foreign Application Priority Data

Jun. 28, 2016   (CN) .......................... 2016 1 0487807

(51) Int. Cl.
*B67C 3/00*   (2006.01)
*B67D 7/02*   (2010.01)
(Continued)

(52) U.S. Cl.
CPC ........... *B67D 7/0266* (2013.01); *B67D 7/166* (2013.01); *B67D 7/301* (2013.01)

(58) Field of Classification Search
CPC ...... B67D 7/0266; B67D 7/38; B67D 7/0238; B67D 7/166
See application file for complete search history.

(56) References Cited

U.S. PATENT DOCUMENTS 1,025,758 A * 5/1912 Martini ................ B67D 7/0238
                                                     222/395
2,781,064 A * 2/1957 Dawkins .............. B67D 7/0266
                                                     141/309
(Continued)

FOREIGN PATENT DOCUMENTS

CN    201002789 Y    1/2008
CN    20163563 U    10/2010
(Continued)

OTHER PUBLICATIONS

Nov. 23, 2017—(CN) First Office Action Appn 201610487807.1 with English Tran.
(Continued)

*Primary Examiner* — Reinaldo Sanchez-Medina
(74) *Attorney, Agent, or Firm* — Banner & Witcoff, Ltd.

(57) ABSTRACT

A liquid transfer apparatus and a control method thereof are provided. The liquid transfer apparatus includes a first auxiliary cover, a second auxiliary cover, a transfer tube and a breathing pipe. The first auxiliary cover is configured to cover a container for holding a liquid to be transferred; and the second auxiliary cover is configured to cover a target container. One end of the transfer tube runs through the first auxiliary cover and the other end runs through the second auxiliary cover. One end of the breathing pipe runs through the first auxiliary cover and the other end is configured to introduce nitrogen, or an inert gas, so that the liquid in the (Continued)

container for holding the liquid to be transferred can be transferred to the target container through the transfer tube.

14 Claims, 4 Drawing Sheets

(51) Int. Cl.
  *B67D 7/16*  (2010.01)
  *B67D 7/30*  (2010.01)

(56) References Cited

U.S. PATENT DOCUMENTS

| | | | |
|---|---|---|---|
| 6,021,921 A * | 2/2000 | Lan | B67D 7/0238 |
| | | | 222/61 |
| 7,942,172 B1 * | 5/2011 | Cuellar | B67C 3/04 |
| | | | 141/234 |
| 8,523,019 B2 | 9/2013 | Drobot et al. | |
| 2009/0301604 A1 | 12/2009 | Williams et al. | |
| 2014/0039671 A1 * | 2/2014 | Raghibizadeh | A61L 2/24 |
| | | | 700/230 |
| 2016/0090287 A1 * | 3/2016 | Riggio | B67C 3/202 |
| | | | 141/83 |

FOREIGN PATENT DOCUMENTS

| | | |
|---|---|---|
| CN | 102105388 A | 6/2011 |
| CN | 103569538 A | 2/2014 |
| CN | 103836330 A | 6/2014 |
| CN | 205011354 U | 2/2016 |
| CN | 106145013 A | 11/2016 |
| EP | 0138168 A2 | 4/1985 |
| JP | 09202397 A | 8/1997 |
| WO | 2007148080 A1 | 12/2007 |

OTHER PUBLICATIONS

Jul. 11, 2017—(WO) International Search Report and Written Opinion Appn PCT/CN2017/086878 with English Tran.

* cited by examiner

LIQUID TRANSFER APPARATUS AND CONTROL METHOD THEREOF

The application is a U.S. National Phase Entry of International Application No. PCT/CN2017/086878 filed on Jun. 1, 2017, designating the United States of America and claiming priority to Chinese Patent Application No. 201610487807.1, filed on Jun. 28, 2016. The present application claims priority to and the benefit of the above-identified applications and the above-identified applications are incorporated by reference herein in their entirety.

TECHNICAL FIELD

Embodiments of the present disclosure relate to a liquid transfer apparatus and a control method thereof.

BACKGROUND

With the increasing maturity of display technology, a variety of display devices have gradually developed. The improvement of the performance of the display device is the focus and difficulty in the current research of display devices. Encapsulating technology has a significant impact on the service life of the display device. The quality of encapsulating adhesive affects the encapsulating quality to a large extent.

Before the encapsulating adhesive is used for encapsulating process, the encapsulating adhesive in a container for holding the encapsulating adhesive needs to be transferred into a container of a deaerator, so as to utilize the deaerator for the defoaming of the encapsulating adhesive. In the transfer process of the encapsulating adhesive, no device is used and simple manual dumping is adopted, so the entire process is exposed in an external environment, and the encapsulating adhesive will be exposed to oxygen or vapor in the external environment, so that the quality of the encapsulating adhesive is impacted.

SUMMARY

Embodiments of the present disclosure provide a liquid transfer apparatus and a control method thereof, which can avoid the reduced quality of the encapsulating adhesive due to the encapsulating adhesive being exposed to the external environment in the transfer process of the encapsulating adhesive.

Embodiments of the present disclosure provide following technical solutions.

According to at least one embodiment of the present disclosure, a liquid transfer apparatus is provided, comprising: a first auxiliary cover, a second auxiliary cover, a transfer tube and a breathing pipe. The first auxiliary cover is configured to cover a container for holding a liquid to be transferred, and the second auxiliary cover is configured to cover a target container. One end of the transfer tube runs through the first auxiliary cover and the other end runs through the second auxiliary cover. One end of the breathing pipe runs through the first auxiliary cover and the other end is configured to introduce nitrogen, or an inert gas, so that the liquid in the container for holding the liquid to be transferred is transferred to the target container through the transfer tube.

For example, the liquid transfer apparatus further comprises a clamping device, the clamping device being configured to open a first cover on the container for holding the liquid to be transferred, and put the first auxiliary cover on the container for holding the liquid to be transferred; and the clamping device being also configured to open a second cover on the target container, and put the second auxiliary cover on the target container.

For example, the liquid transfer apparatus further comprises a driving member and a telescopic structure. The driving member is connected with the telescopic structure and configured to drive the telescopic structure to move, or rotate; and one end of the telescopic structure is connected with the clamping device and configured to drive the clamping device to move, or rotate.

For example, the liquid transfer apparatus further comprises a slide rail, the other end of the telescopic structure being disposed on the slide rail.

For example, the clamping device comprises a first clamp configured to clamp the first cover of the container for holding the liquid to be transferred, or the first auxiliary cover; and a second clamp configured to clamp the second cover of the target container, or the second auxiliary cover.

For example, both the first clamp and the second clamp comprise a fixed part and a moving part, the fixed part being connected with the moving part, and the moving part being configured to clamp the covers and movable on the fixed part.

For example, the first auxiliary cover comprises a first auxiliary subpart; and the second auxiliary cover comprises a second auxiliary subpart. Both a part of the first auxiliary subpart stretched into the container for holding the liquid to be transferred and a part of the second auxiliary subpart stretched into the target container are made of an elastic cotton, and the elastic cotton contacts an inner wall of the container.

For example, the first auxiliary cover further comprises a first fixing subpart; and the second auxiliary cover further comprises a second fixing subpart; the inside of the first fixing subpart is provided with threads which are matched with a container mouth of the container for holding the liquid to be transferred; and the first fixing subpart covers the outside of the first auxiliary subpart and is configured to fix the first auxiliary subpart; the inside of the second fixing subpart is provided with threads which are matched with a container mouth of the target container; and the second fixing subpart covers the outside of the second auxiliary subpart and is configured to fix the second auxiliary subpart.

For example, the liquid transfer apparatus further comprises a valve disposed on the transfer tube and configured to control the on/off of the transfer tube.

For example, the liquid transfer apparatus further comprises a weighing bridge, the target container being placed on the weighing bridge.

For example, the liquid transfer apparatus further comprises a cover placing platform configured to place the covers.

For example, the liquid to be transferred is an encapsulating adhesive.

According to an embodiment of the present disclosure, a control method of the liquid transfer apparatus is provided, comprising: putting the first auxiliary cover on the container for holding the liquid to be transferred, and putting the second auxiliary cover on the target container; and introducing nitrogen, or an inert gas into the breathing pipe, so that the liquid in the container for holding the liquid to be transferred is transferred to the target container through the transfer tube.

For example, in a case that the liquid transfer apparatus comprises the clamping device, the putting of the first auxiliary cover on the container for holding the liquid to be transferred and the putting of the second auxiliary cover on the target container comprises: utilizing the clamping device to open the first cover on the container for holding the liquid to be transferred, and putting the first auxiliary cover on the container for holding the liquid to be transferred; and utilizing the clamping device to open the second cover on the target container, and putting the second auxiliary cover on the target container.

For example, in a case that the liquid transfer apparatus further comprises the driving member and the telescopic structure, the utilizing of the clamping device to open the first cover on the container for holding the liquid to be transferred, and putting the first auxiliary cover on the container for holding the liquid to be transferred comprises: the driving member driving the telescopic structure to move to the top of the container for holding the liquid to be transferred, the clamping device clamping the first cover on the container for holding the liquid to be transferred, and the driving member driving the telescopic structure to rotate, to open the first cover on the container for holding the liquid to be transferred; and the driving member driving the clamping device to move to the top of the first auxiliary cover and clamp the first auxiliary cover, and the driving member driving the telescopic structure to move to the top of the container for holding the liquid to be transferred, and driving the telescopic structure to rotate, to put the first auxiliary cover on the container for holding the liquid to be transferred. The utilizing of the clamping device to open the second cover on the target container, and put the second auxiliary cover on the target container comprises: the driving member driving the telescopic structure to move to the top of the target container, the clamping device clamping the second cover on the target container, and the driving member driving the telescopic structure to rotate, to open the second cover on the target container; and the driving member driving the clamping device to move to the top of the second auxiliary cover and clamp the second auxiliary cover, and the driving member driving the telescopic structure to move to the top of the target container, and driving the telescopic structure to rotate, to put the second auxiliary cover on the target container.

For example, in a case that the clamping device comprises the first clamp and the second clamp, the utilizing of the clamping device to open the first cover on the container for holding the liquid to be transferred, and put the first auxiliary cover on the container for holding the liquid to be transferred, and the utilizing of the clamping device to open the second cover on the target container, and put the second auxiliary cover on the target container comprises: utilizing the first clamp to open the first cover on the container for holding the liquid to be transferred, and put the first auxiliary cover on the container for holding the liquid to be transferred; and utilizing the second clamp to open the second cover on the target container, and put the second auxiliary cover on the target container.

BRIEF DESCRIPTION OF THE DRAWINGS

Embodiments of the present disclosure will be described in more detail below with reference to accompanying drawings to allow an ordinary skill in the art to more clearly understand embodiments of the present disclosure, in which.

DETAILED DESCRIPTION

Technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the disclosure.

Figure 1:
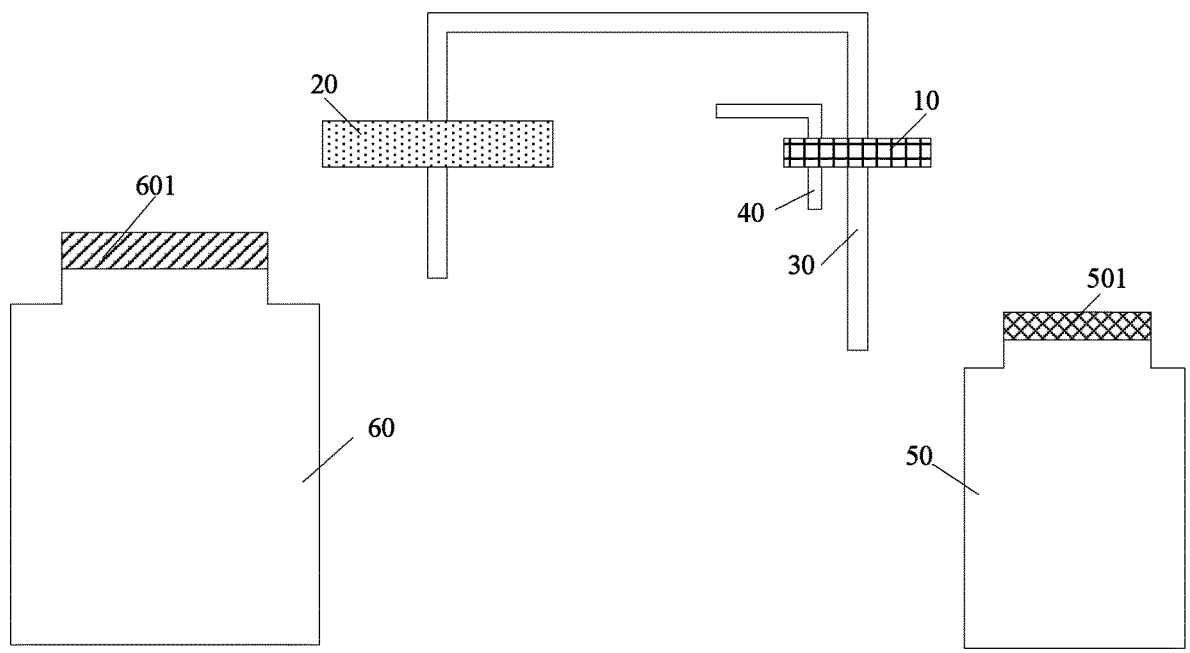
FIG. 1 is a schematic structural view 1 of a liquid transfer apparatus provided by an embodiment of the present disclosure.
Figure 8:
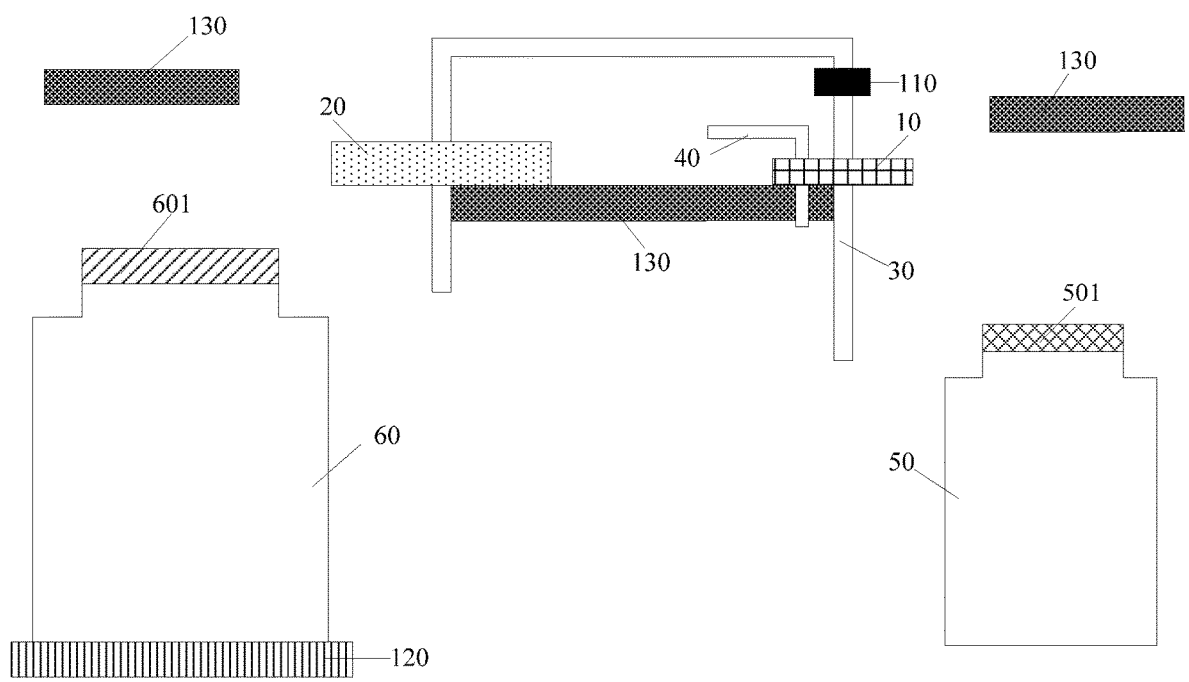
FIG. 8 is a schematic structural view 4 of a liquid transfer apparatus provided by an embodiment of the present disclosure.
Figure 10:
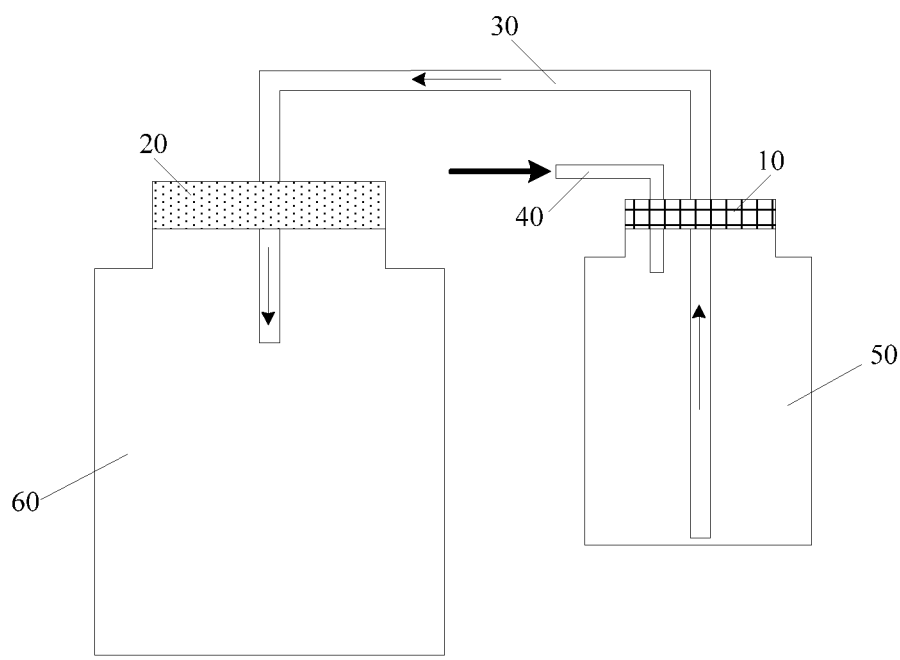
FIG. 10 is a schematic structural view 5 of the liquid transfer apparatus provided by an embodiment of the present disclosure.

Some embodiments of the present disclosure provide a liquid transfer apparatus, as shown in FIGS. 1, 8 and 10, which includes a first auxiliary cover 10, a second auxiliary cover 20, a transfer tube 30 and a breathing pipe 40. The first auxiliary cover 10 is configured to cover a container 50 for holding a liquid to be transferred. The second auxiliary cover 20 is configured to cover a target container 60. One end of the transfer tube 30 runs through the first auxiliary cover 10 and the other end runs through the second auxiliary cover 20. One end of the breathing pipe 40 runs through the first auxiliary cover 10 and the other end is configured to introduce nitrogen, or an inert gas, so that the liquid in the container 50 for holding the liquid to be transferred can be transferred to the target container 60 through the transfer tube 30.

The liquid transfer process of the liquid transfer apparatus provided by the embodiment of the present disclosure is, for instance, as follows: opening a first cover 501 of the container 50 for holding the liquid to be transferred and a second cover 601 of the target container 60; secondly, putting the first auxiliary cover 10 on the container 50 for holding the liquid to be transferred, and putting the second auxiliary cover 20 on the target container 60; then, introducing nitrogen, or an inert gas into the breathing pipe 40. As the pressure intensity in the container 50 for holding the liquid to be transferred is increased after the inert gas is introduced into the breathing pipe 40, the liquid in the container 50 for holding the liquid to be transferred can be transferred into the target container 60 through the transfer tube 30.

It should be noted that the shape of the first auxiliary cover 10 and the second auxiliary cover 20 is not limited to the shape as shown in the figure. As the first auxiliary cover 10 covers the container 50 for holding the liquid to be transferred during the liquid transferring, and to ensure that oxygen and vapor in the external environment cannot enter the container 50 for holding the liquid to be transferred during the liquid transferring, the first auxiliary cover 10 should be completely matched with a container mouth of the container 10 for holding the liquid to be transferred. Similarly, the second auxiliary cover 20 should be completely matched with a container mouth of the target container 60.

In this way, the first auxiliary cover 10 and the second auxiliary cover 20 may be disposed between the container 50 for holding the liquid to be transferred and the target container 60; and the first auxiliary cover 10 is close to the container 50 for holding the liquid to be transferred, and the second auxiliary cover 20 is close to the target container 60. In this way, on one hand, in the transfer process, the first auxiliary cover 10 can be conveniently put on the container 50 for holding the liquid to be transferred, and the second auxiliary cover 20 can be conveniently put on the target container 60; on the other hand, the length of the transfer tube 30 can be reduced.

For the liquid transfer apparatus to completely transfer the liquid in the container 50 for holding the liquid to be transferred into the target container 60, in an embodiment of the present disclosure, for instance, the length of the transfer tube 30 stretched into the container 50 for holding the liquid to be transferred is close to the height of the container 50 for holding the liquid to be transferred, so that a tail end of the transfer tube 30 can almost contact the bottom of the container 50 for holding the liquid to be transferred, while the length of the transfer tube 30 stretched into the target container 60 can be shorter to transfer the liquid into the target container 60.

In addition, the length of the transfer tube 30 between the first auxiliary cover 10 and the second auxiliary cover 20 can be reasonably designed according to the distance between the container 50 for holding the liquid to be transferred and the target container 60.

For instance, the transfer tube 30 between the first auxiliary cover 10 and the second auxiliary cover 20 may adopt a telescopic tube capable of adjusting the length, so that the length of the transfer tube 30 can be conveniently adjusted according to the distance between the container 50 for holding the liquid to be transferred and the target container 60.

Herein, when the tail end of the transfer tube 30 is stretched into the bottom of the container 50 for holding the liquid to be transferred, if the nitrogen, or the inert gas is introduced into the breathing pipe 40, the liquid in the container 50 for holding the liquid to be transferred can be completely transferred into the target container 60. For a liquid with high viscosity, the embodiment of the present disclosure can more completely transfer the liquid and avoid the waste of the liquid.

Nitrogen may be introduced into the breathing pipe 40, or an insert gas may be introduced into the breathing pipe 40, so as to provide transfer power in the transfer process. The inert gas introduced into the breathing pipe 40, for instance, may be helium, argon, neon, or the like, but the embodiments of the present disclosure are not limited thereto.

The material of the transfer tube 30 and the breathing pipe 40, for instance, may be a plastic material—polyvinyl chloride (PVC), but the embodiments of the present disclosure are not limited thereto.

The size and the shape of the container 50 and the target container 60 may be the size and the shape of an actually used container. In addition, the liquid to be transferred, for instance, may be an encapsulating adhesive, or other fluids or semi-fluids required to be transferred from one container to another container.

In the liquid transfer apparatus provided by the embodiment of the present disclosure, during the liquid transferring, the first auxiliary cover 10 is put on the container 50 for holding the liquid to be transferred; the second auxiliary cover 20 is put on the target container 60; and when nitrogen, or an inert gas is introduced into the breathing pipe 40, the liquid in the container 50 for holding the liquid to be transferred can be transferred into the target container 60. In the embodiment of the present disclosure, the transfer tube 30 is adopted for transferring a liquid, and the container 50 for holding the liquid to be transferred and the target container 60 are respectively covered by the first auxiliary cover 10 and the second auxiliary cover 20 in the transfer process. In this way, in the liquid transfer process, the embodiment can avoid the impact on the quality of the liquid due to the liquid being exposed to the external environment. When the liquid transfer apparatus is used for transferring the encapsulating adhesive, it can avoid the reduced quality of the encapsulating adhesive due to the encapsulating adhesive being exposed to the external environment in the transfer process.

Figure 2:
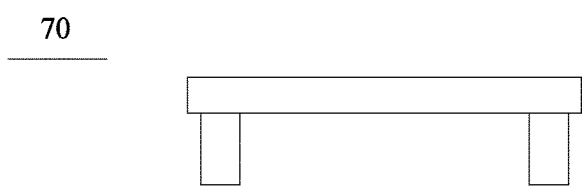
FIG. 2 is a schematic structural view of a clamping device provided by an embodiment of the present disclosure.

For instance, as shown in FIG. 2, the liquid transfer apparatus further comprises a clamping device 70 which is configured to open the first cover 501 on the container 50 for holding the liquid to be transferred, and put the first auxiliary cover 10 on the container 50 for holding the liquid to be transferred; and configured to open the second cover 601 on the target container 60, and put the second auxiliary cover 20 on the target container 60.

Figure 11:
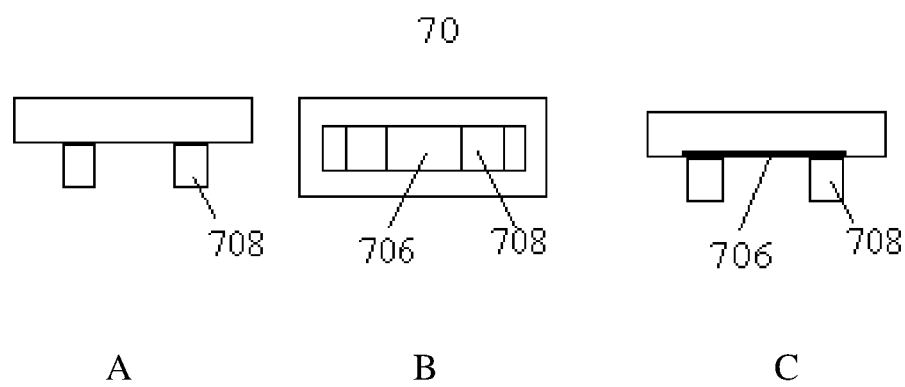
FIGS. 11A-C are schematic structural views of a clamping structure in an embodiment of the present disclosure.

The structure of the clamping device 70 can open the first cover 501 on the container 50 for holding the liquid to be transferred, and put the first auxiliary cover 10 on the container 50 for holding the liquid to be transferred; and can open the second cover 601 on the target container 60, and put the second auxiliary cover 20 on the target container 60. For instance, the clamping device 70 is a clamp structure. For instance, as shown in FIGS. 11A-C, a clamp structure 70 includes magnet 706, and two fasteners 708 disposed in a frame.

Herein, the clamping device 70 can simultaneously open the first cover 501 on the container 50 for holding the liquid to be transferred and the second cover 601 on the target container 60; or may open the first cover 501 on the container 50 for holding the liquid to be transferred at first, then open the second cover 601 on the target container 60; or open the second cover 601 on the target container 60 at first, then open the first cover 501 on the container 50 for holding the liquid to be transferred. Similarly, the clamping device 70 may simultaneously put the first auxiliary cover 10 on the container 50 for holding the liquid to be transferred and put the second auxiliary cover 20 on the target container 60; or the clamping device 70 may put the first auxiliary cover 10 on the container 50 for holding the liquid to be transferred at first, then put the second auxiliary cover 20 on the target container 60; or the clamping device 70 may put the second auxiliary cover 20 on the target container 60 at first, then put the first auxiliary cover 10 on the container 50 for holding the liquid to be transferred.

It should be noted that: after the completion of the liquid transfer process, the clamping device 70 may be adopted to open the first auxiliary cover 10, and put the first cover 501 of the container 50 for holding the liquid to be transferred on the container 50 for holding the liquid to be transferred; and the clamping device 70 may be adopted to open the second auxiliary cover 20, and put the second cover 601 of the target container 60 on the target container 60.

In addition, in an embodiment of the present invention, for instance, the arrangement positions of the container 50 for holding the liquid to be transferred, the first cover 501 of the container 50 for holding the liquid to be transferred, the target container 60, the second cover 601 of the target container 60, the first auxiliary cover 10 and the second auxiliary cover 20 are changeless, so that the clamping device 70 can accurately clamp the cover after remembering the positions.

The embodiments of the present invention can adopt the clamping device 70 to open, or cover the first cover 501 of the container 50 for holding the liquid to be transferred, the second cover 601 of the target container 60, the first auxiliary cover 10, or the second auxiliary cover 20, and can further prevent the phenomenon that particles carried by an operator are mixed into the liquid as the operator is close to the container 50 for holding the liquid to be transferred and the target container 60.

Figure 3:
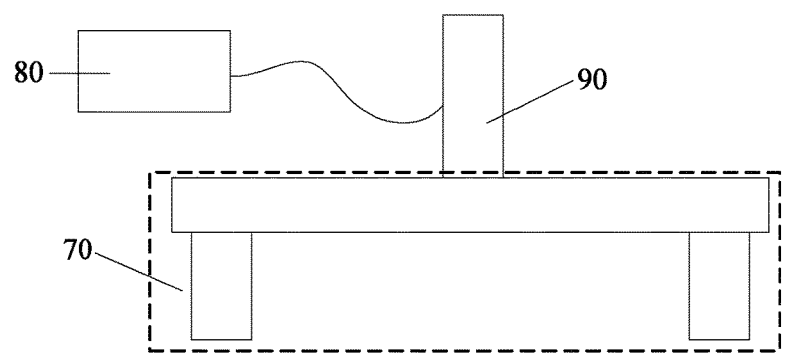
FIG. 3 is a schematic structural view 2 of the liquid transfer apparatus provided by an embodiment of the present disclosure.

For instance, as shown in FIG. 3, the liquid transfer apparatus further comprises a driving member 80 and a telescopic structure 90; the driving member 80 is connected with the telescopic structure 90 and configured to drive the telescopic structure 90 to move, or rotate; and one end of the telescopic structure 90 is connected with the clamping device 70, and configured to drive the clamping device 70 to move, or rotate.

The driving member 80, for instance, may be a cylinder or motor, but the embodiments of the present disclosure are not limited thereto.

Herein, it should be noted that the movements in the embodiments of the present disclosure may be a transverse movement, or a longitudinal movement.

In the embodiment of the present disclosure, as the driving member 80 can drive the telescopic structure 90 to move and the telescopic structure 90 is connected with the clamping device 70, the telescopic structure 90 can drive the clamping device 70 to move to the top of the container 50 for holding the liquid to be transferred, or the top of the target container 60, so as to open or cover the first cover 501 of the container 50 for holding the liquid to be transferred, or the second cover 601 of the target container 60; or open, or cover the first auxiliary cover 10, or the second auxiliary cover 20. When the driving member 80 drives the telescopic structure 90 to move, so as to drive the clamping device 70 to move to the top of the container 50 for holding the liquid to be transferred, or the top of the target container 60, the clamping device 70 clamps the cover on the container 50 for holding the liquid to be transferred (the cover here may be the first cover 501 of the container 50 for holding the liquid to be transferred, or may be the first auxiliary cover 10), or the cover on the target container 60 (the cover here may be the second cover 601 of the target container 60, or may be the second auxiliary cover 20); and the driving member 80 may also drive the telescopic structure 90 to rotate, so as to drive the clamping device 70 to rotate, and open, or close the cover on the container 50 for holding the liquid to be transferred, or the cover on the target container 60.

In the embodiment of the present disclosure, the liquid transfer apparatus comprises the driving member 80 and the telescopic structure 90. The driving member 80 can drive the telescopic structure 90 to move, or rotate, so as to drive the clamping device 70 to move, or rotate, so that the clamping device 70 can open, or close the cover on the container 50 for holding the liquid to be transferred, or the target container 60 at different heights.

Figure 4:
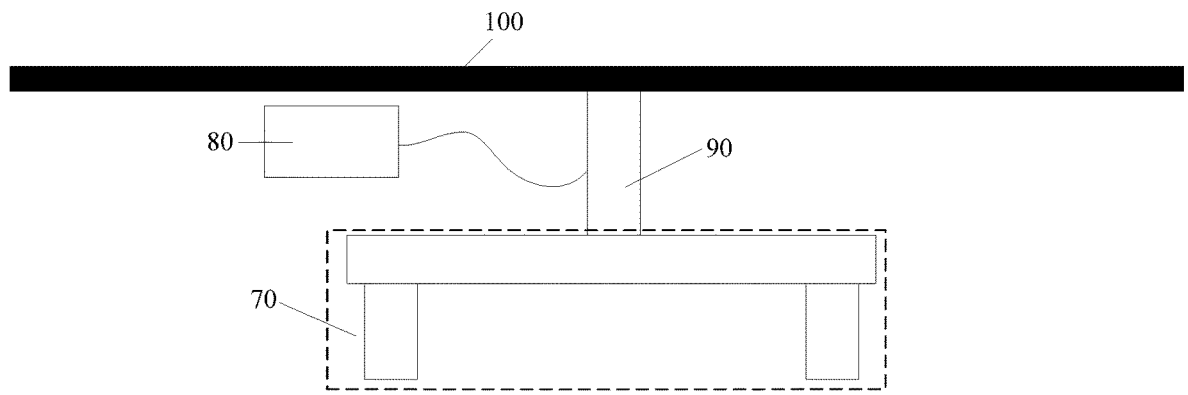
FIG. 4 is a schematic structural view 3 of the liquid transfer apparatus provided by an embodiment of the present disclosure.

Moreover, for instance, as shown in FIG. 4, the liquid transfer apparatus also comprises a slide rail 100; and the other end of the telescopic structure 90 is arranged on the slide rail 100.

The telescopic structure 90 may move along the slide rail 100.

The slide rail 100 in the embodiment of the present disclosure can provide a rail for the transverse movement of the telescopic structure 90. When the container 50 for holding the liquid to be transferred, or the target container 60 is placed under the slide rail 100, the telescopic structure 90 can be conveniently, accurately and quickly moved over the container 50 for holding the liquid to be transferred, or the target container 60, so that the telescopic structure 90 after longitudinal movement can drive the clamping device 70 to accurately and quickly clamp the cover on the container 50 for holding the liquid to be transferred (the cover here may be the first cover 501 of the container 50 for holding the liquid to be transferred, or may be the first auxiliary cover 10), or the cover on the target container 60 (the cover here may be the second cover 601 of the target container 60, or may be the second auxiliary cover 20).

Figure 5:
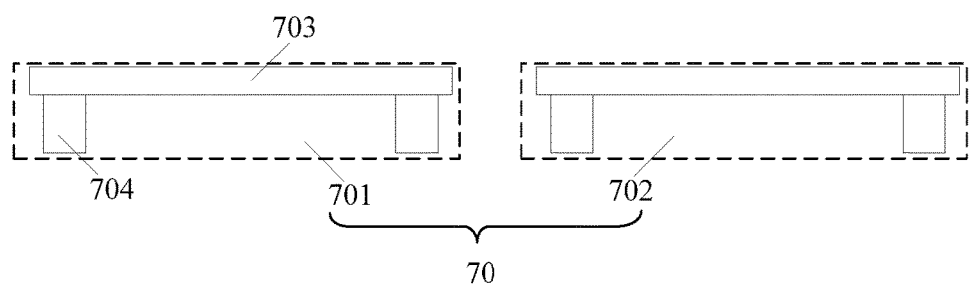
FIG. 5 is a schematic structural view showing a clamping device with two clamps in an embodiment of the present disclosure.

For instance, as shown in FIG. 5, the clamping device 70 includes a first clamp 701 and a second clamp 702. The first clamp 701 is configured to clamp the first cover 501 of the container 50 for holding the liquid to be transferred, or the first auxiliary cover 10. The second clamp 702 is configured to clamp the second cover 601 of the target container 60, or the second auxiliary cover 20.

For instance, the structure of the first clamp 701 and the second clamp 702 may be same, or different.

In the embodiment of the present disclosure, as the clamping device 70 includes the first clamp 701 and the second clamp 702, the first clamp 701 and the second clamp 702 can simultaneously open, or cover the first cover 501 on the container 50 for holding the liquid to be transferred and the second cover 601 on the target container 60; or the first clamp 701 and the second clamp 702 can simultaneously open, or cover the first auxiliary cover 10 and the second auxiliary cover 20. In this way, the transfer efficiency of the liquid transfer apparatus can be improved.

For instance, as shown in FIG. 5, both the first clamp 701 and the second clamp 702 include a fixed portion 703 and a moving portion 704; the fixed portion 703 is connected with the moving portion 704; and the moving portion 704 is configured to clamp the cover and may move on the fixed portion 703.

It should be noted that the cover here may be the first cover 501 on the container 50 for holding the liquid to be transferred, or the second cover 601 on the target container 60, or the first auxiliary cover 10, or the second auxiliary cover 20.

Due to the design of the structure of the fixed portion 703 and the moving portion 704, the moving portion 704 can move on the fixed portion 703, so that the first clamp 701 and the second clamp 702 can clamp covers of different sizes.

Exemplarily, the fixed portion 703 is a magnet, or a magnet is disposed on a lower surface of the fixed portion 703, and the moving portion 704 is made of a magnetic material. In this way, the moving portion 704 can move on the fixed portion 703, so that the first clamp 701 and the second clamp 702 can be applicable to clamp covers of different sizes.

In the embodiment of the present disclosure, as both the first clamp 701 and the second clamp 702 include the fixed portion 703 and the moving portion 704, and the moving portion 704 can move on the fixed portion 703, the first clamp 701 and the second clamp 702 can grasp or clamp covers of different sizes by adjustment of the moving portion 704.

Figure 6:
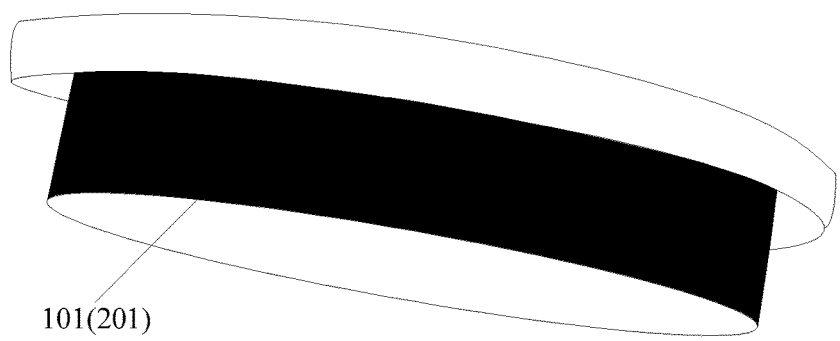
FIG. 6 is a schematic structural view of a first auxiliary cover or a second auxiliary cover in an embodiment of the present disclosure.
Figure 7:
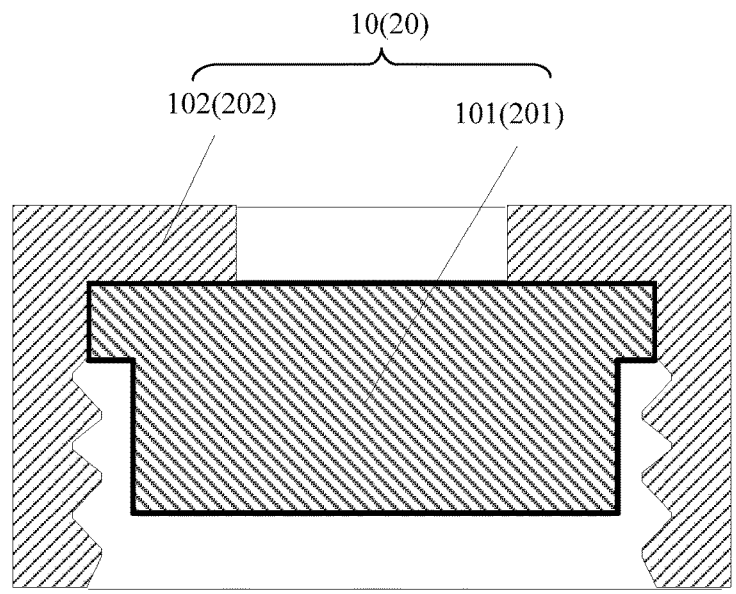
FIG. 7 is a schematic structural sectional view of the first auxiliary cover or the second auxiliary cover in an embodiment of the present disclosure.

For instance, as shown in FIG. 6 or 7, the first auxiliary cover 10 includes a first auxiliary subpart 101; the second auxiliary cover 20 includes a second auxiliary subpart 201; and both a part of the first auxiliary subpart 101 stretched into the container 50 for holding the liquid to be transferred and a part of the second auxiliary subpart 201 stretched into the target container 60 are made of an elastic cotton, and the elastic cotton contacts an inner wall of the container.

A variety of elastic cotton materials, or materials with good sealability and elasticity may be selected. The shape and the size of the first auxiliary subpart 101 and the second auxiliary subpart 201 are so designed that the first auxiliary subpart 101 can be matched with the container 50 for holding the liquid to be transferred, and the second auxiliary subpart 201 can be matched with the target container 60. The first auxiliary subpart 101 and the second auxiliary subpart 201, for instance, may be a plug. The part of the first auxiliary subpart 101 and the part of the second auxiliary subpart 201 stretched into the container may also be a ring structure. The ring structure contacts the wall of the container 50 for holding the liquid to be transferred, or the wall of the target container 60. But the embodiments of the present disclosure are not limited thereto.

Herein, both the part of the first auxiliary subpart 101 stretched into the container 50 for holding the liquid to be transferred and the part of the second auxiliary subpart 201 stretched into the target container 60 are made of an elastic cotton material (as shown by a black part in FIG. 6). Other parts of the first auxiliary subpart 101 and the second auxiliary subpart 201 may be made of the elastic cotton material, or other materials.

In the embodiment of the present disclosure, as both the part of the first auxiliary subpart 101 stretched into the container 50 for holding the liquid to be transferred and the part of the second auxiliary subpart 201 stretched into the target container 60 are made of the elastic cotton, and the elastic cotton contacts the inner walls of the containers. In this way, the first auxiliary subpart 101 and the second auxiliary subpart 201 can respectively contact the container 50 for holding the liquid to be transferred and the target container 60 closely, so that the container 50 for holding the liquid to be transferred and the target container 60 can be kept in a sealed environment, and the problem of reduced liquid quality due to oxygen and vapor in the external environment entering the container 50 and the target container 60 can be avoided.

For instance, as shown in FIG. 7, the first auxiliary cover 10 also includes a first fixing subpart 102; the second auxiliary cover 20 also includes a second fixing subpart 202; the inside of the first fixing subpart 102 is provided with threads matched with the container mouth of the container 50 for holding the liquid to be transferred; and the first fixing subpart 102 covers the outside of the first auxiliary subpart 101 and is configured to fix the first auxiliary subpart 101.

The inside of the second fixing subpart 202 is provided with threads which are matched with the container mouth of the target container 60. The second fixing subpart 202 covers the outside of the second auxiliary subpart 201 and is configured to fix the second auxiliary subpart 201.

In the embodiment of the present disclosure, as both the part of the first auxiliary subpart 101 stretched into the container 50 for holding the liquid to be transferred and the part of the second auxiliary subpart 201 stretched into the target container 60 are made of the elastic cotton, and the friction force between the elastic cotton and the container is small, during the liquid transferring, when the air pressure produced by the nitrogen, or the inert gas introduced into the container 50 for holding the liquid to be transferred is high, the first auxiliary subpart 101 and the second auxiliary subpart 201 may be bounced off. In the embodiment of the present disclosure, the first fixing subpart 102 and the second fixing subpart 202 are respectively disposed to fix the first auxiliary subpart 101 and the second auxiliary subpart 201, so as to prevent the first auxiliary subpart 101 and the second auxiliary subpart 201 from being bounced off due to an over-high air pressure in the container 50 for holding the liquid to be transferred and the target container 60 during the liquid transferring.

For instance, as shown in FIG. 8, the liquid transfer apparatus also comprises a valve 110 disposed on the transfer tube 30 and configured to control the on/off of the transfer tube 30.

When the amount of the liquid transferred into the target container 60 has met the requirement, or the liquid in the target container 60 is full, although nitrogen, or an inert gas is not introduced into the breathing pipe 40 again, the air pressure retained in the container 50 for holding the liquid to be transferred may allow the liquid in the container 50 for holding the liquid to be transferred to be transferred into the target container 60 continuously, resulting in inaccurate amount of liquid in the target container 60, or liquid overflow. In the embodiment of the present disclosure, the valve 110 is provided on the transfer tube 30. In this way, when no liquid transfer is needed, the valve 110 may be adopted to control the transfer tube 30 to be switched off, so as to prevent the liquid in the container 50 for holding the liquid to be transferred from being transferred into the target container 60.

In addition, a valve (not shown in the accompanying drawings of the embodiment of the present disclosure) may also be disposed on the breathing pipe 40. When no liquid is required to be transferred into the target container 60, the valve may be closed to switch off the breathing pipe 40. In this way, as the air pressure in the container 50 for holding the liquid to be transferred is low, the liquid in the container 50 for holding the liquid to be transferred cannot be transferred into the target container 60.

For instance, as shown in FIG. 8, the liquid transfer apparatus also comprises a weighing bridge 120; and the target container 60 is placed on the weighing bridge 120.

As the liquid transfer apparatus provided by the embodiment of the present disclosure also comprises the weighing bridge 120, the liquid transfer amount can be accurately monitored by the weighing bridge 120.

It should be noted that: after the transfer of quantitative liquid is completed, another container 50 for holding the liquid to be transferred or another target container 60 may be replaced continually as required.

For instance, as shown in FIG. 8, the liquid transfer apparatus also comprises cover placing platforms 130 configured to place the covers.

For instance, the liquid transfer apparatus may comprise one cover placing platform 130, or may comprise two or more cover placing platforms 130.

It should be noted that the cover may be the first cover 501 of the container 50 for holding the liquid to be transferred, the second cover 601 of the target container 60, the first auxiliary cover 10, or the second auxiliary cover 20.

The liquid transfer apparatus may comprise one cover placing platform 130. The first cover 501 for holding the liquid to be transferred, the second cover 601 of the target container 60, the first auxiliary cover 10 and the second auxiliary cover 20 may all be placed on the cover placing platform 130; or as shown in FIG. 8, the liquid transfer apparatus comprises three cover placing platforms 130. One cover placing platform 130 is configured to place the first auxiliary cover 10 and the second auxiliary cover 20; one cover placing platform 130 is configured to place the first cover 501 of the container 50 for holding the liquid to be transferred; and one cover placing platform 130 is configured to place the second cover 601 of the target container 60. For the convenience of clamping the cover, in an embodiment of the present disclosure, for instance, the first cover 501 of the container 50 for holding the liquid to be transferred, the second cover 601 of the target container 60, the first auxiliary cover 10 and the second auxiliary cover 20 are placed onto corresponding cover placing platform 130 base on the proximity principle.

In the embodiment of the present disclosure, when not used, the cover may be placed onto the cover placing platform 130, so as to prevent the cover from being polluted and then prevent the liquid in the container 50 for holding the liquid to be transferred, or the target container 60 from being polluted.

Figure 9:
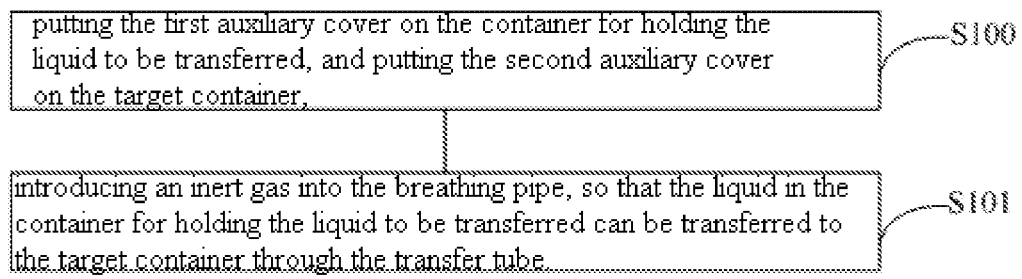
FIG. 9 is a flow diagram of a control method of the liquid transfer apparatus, provided by an embodiment of the present disclosure.

The embodiment of the present disclosure also provides a control method of the liquid transfer apparatus, which, as shown in FIG. 9, comprises the following steps.

S100: as shown in FIG. 10, putting the first auxiliary cover 10 on the container 50 for holding the liquid to be transferred, and putting the second auxiliary cover 20 on the target container 60.

Herein, it should be understood by those skilled in the art that: before the step of putting the first auxiliary cover 10 on the container 50 for holding the liquid to be transferred and putting the second auxiliary cover 20 on the target container 60, the method may also comprises: opening the first cover 501 of the container 50 for holding the liquid to be transferred (the first cover 501 is not shown in FIG. 10), and opening the second cover 601 of the target container 60 (the second cover 601 is not shown in FIG. 10).

S101: as shown in FIG. 10, introducing nitrogen, or an inert gas into the breathing pipe 40 (as shown by a bold black arrow in FIG. 10), so that the liquid in the container 50 for holding the liquid to be transferred can be transferred into the target container 60 through the transfer tube 30.

It should be noted that: for the liquid transfer apparatus to completely transfer the liquid in the container 50 for holding the liquid to be transferred into the target container 60, for instance, the length of the transfer tube 30 in the embodiment of the present disclosure stretched into the container 50 for holding the liquid to be transferred is close to the height of the container 50 for holding the liquid to be transferred, so that a tail end of the transfer tube 30 can almost contacts the bottom of the container 50 for holding the liquid to be transferred. The length of the transfer tube 30 stretched into the target container 60 may be shorter to transfer the liquid into the target container 60.

The length of the transfer tube 30 between the first auxiliary cover 10 and the second auxiliary cover 20 may be set and adjusted according to the distance between the container 50 for holding the liquid to be transferred and the target container 60.

For instance, the transfer tube 30 between the first auxiliary cover 10 and the second auxiliary cover 20 may adopt a telescopic tube with its length being adjustable, so as to be adjusted conveniently according to the distance between the container 50 for holding the liquid to be transferred and the target container 60.

Herein, nitrogen may be introduced into the breathing pipe 40, or an inert gas may be introduced into the breathing pipe 40. For instance, the inert gas introduced into the breathing pipe 40 may be helium, argon, neon, or the like.

In the control method of the liquid transfer apparatus provided by the embodiment of the present disclosure, during the liquid transferring, the first auxiliary cover 10 is put on the container 50 for holding the liquid to be transferred; the second auxiliary cover 20 is put on the target container 60; and when the nitrogen, or the inert gas is introduced into the breathing pipe 40, the liquid in the container 50 for holding the liquid to be transferred can be transferred into the target container 60 through the transfer tube 30. In the embodiment of the present disclosure, the transfer tube 30 is adopted for transferring the liquid; and in the transfer process, the container 50 for holding the liquid to be transferred and the target container 60 are respectively covered by the first auxiliary cover 10 and the second auxiliary cover 20. In this way, in the liquid transfer process, the embodiment can avoid the impact on the quality of the liquid due to the liquid being exposed to the external environment. When the liquid transfer apparatus is used for transferring the encapsulating adhesive, the reduced quality of the encapsulating adhesive due to the encapsulating adhesive being exposed to the external environment in the transfer process can be avoided.

For instance, as shown in FIG. 2 or 3, when the liquid transfer apparatus comprises the clamping device 70, the step S100 includes utilizing the clamping device 70 to open the first cover 501 on the container 50 for holding the liquid to be transferred, and put the first auxiliary cover 10 on the container 50 for holding the liquid to be transferred; and utilizing the clamping device 70 to open the second cover 601 on the target container 60, and put the second auxiliary cover 20 on the target container 60.

The clamping device 70 may adopt a variety of structures capable of opening the first cover 501 on the container 50 for holding the liquid to be transferred, and putting the first auxiliary cover 10 on the container 50 for holding the liquid to be transferred; and opening the second cover 601 on the target container 60, and putting the second auxiliary cover 20 on the target container 60.

Herein, the clamping device 70 may simultaneously open the first cover 501 on the container 50 for holding the liquid to be transferred, and the second cover 601 on the target container 60; or, it may open the first cover 501 on the container 50 for holding the liquid to be transferred at first, then open the second cover 601 on the target container 60; or open the second cover 601 on the target container 60 at first, then open the first cover 501 on the container 50 for holding the liquid to be transferred. Likewise, the clamping device 70 may simultaneously put the first auxiliary cover 10 on the container 50 for holding the liquid to be transferred and put the second auxiliary cover 20 on the target container 60; or, it may put the first auxiliary cover 10 on the container 50 for holding the liquid to be transferred at first, then put the second auxiliary cover 20 on the target container 60; or put the second auxiliary cover 20 on the target container 60 at first, then put the first auxiliary cover 10 on the container 50 for holding the liquid to be transferred.

It should be noted that: after the completion of the liquid transfer process, the clamping device 70 may be adopted to open the first auxiliary cover 10, and put the first cover 501 of the container 50 for holding the liquid to be transferred on the container 50; and the clamping device 70 is adopted to open the second auxiliary cover 20, and put the second cover 601 of the target container 60 on the target container 60.

As the clamping device 70 may be adopted to open or close the first cover 501 of the container 50 for holding the liquid to be transferred, the second cover 601 of the target container 60, the first auxiliary cover 10, or the second auxiliary cover 20, the embodiment of the present disclosure can further prevent the phenomenon that particles carried by the operator are mixed into the liquid as the operator is close to the container 50 for holding the liquid to be transferred and the target container 60.

For instance, as shown in FIG. 3, when the liquid transfer apparatus also comprises the driving member 80 and the telescopic structure 90, the step of utilizing the clamping device 70 to open the first cover 501 on the container 50 for holding the liquid to be transferred, and put the first auxiliary cover 10 on the container 50 for holding the liquid to be transferred includes: the driving member 80 driving the telescopic structure 90 to move to the top of the container 50 for holding the liquid to be transferred, the clamping device 70 clamping the first cover 501 on the container 50 for holding the liquid to be transferred, and the driving member 80 driving the telescopic structure 90 to rotate, so as to open the first cover 501 on the container 50 for holding the liquid to be transferred; and the driving member 80 driving the clamping device 70 to move to the top of the first auxiliary cover 10 and clamp the first auxiliary cover 10, and the driving member 80 driving the telescopic structure 90 to move to the top of the container 50 for holding the liquid to be transferred, and driving the telescopic structure 90 to rotate, so as to put the first auxiliary cover 10 on the container 50 for holding the liquid to be transferred.

The step of utilizing the clamping device 70 to open the second cover 601 on the target container 60 and put the second auxiliary cover 20 on the target container 601 includes: the driving member 80 driving the telescopic structure 90 to move to the top of the target container 60, the clamping device 70 clamping the second cover 601 on the target container 60, and the driving member 80 driving the telescopic structure 90 to rotate, so as to open the second cover 601 on the target container 60; and the driving member 80 driving the clamping device 70 to move to the top of the second auxiliary cover 20 and clamp the second auxiliary cover 20, and the driving member 80 driving the telescopic structure 90 to move to the top of the target container 60, and driving the telescopic structure 90 to rotate, so as to put the second auxiliary cover 20 on the target container 60.

The structure of the driving member 80, for instance, may be a cylinder or a motor, but the embodiments of the present disclosures are not limited thereto.

Herein, it should be noted that the movement in the embodiment of the present disclosure may be a transverse movement or may be a longitudinal movement.

In the embodiment of the present disclosure, as the liquid transfer apparatus comprises the driving member 80 and the telescopic structure 90, and the driving member 80 can drive the telescopic structure 90 to move, or rotate, so as to drive the clamping device 70 to move, or rotate, the clamping device 70 can grasp or clamp the cover on the container 50 for holding the liquid to be transferred, or the target container 60 at different heights.

For instance, as shown in FIG. 5, when the clamping device 70 includes the first clamp 701 and the second clamp 702, the step of utilizing the clamping device 70 to open the first cover 501 on the container 50 for holding the liquid to be transferred, and put the first auxiliary cover 10 on the container 50 for holding the liquid to be transferred, and utilizing the clamping device 70 to open the second cover 601 on the target container 60, and put the second auxiliary cover 20 on the target container 60 includes: utilizing the first clamp 701 to open the first cover 501 on the container 50 for holding the liquid to be transferred, and put the first auxiliary cover 10 on the container 50 for holding the liquid to be transferred; and utilizing the second clamp 702 to open the second cover 601 on the target container 60, and put the second auxiliary cover 20 on the target container 60.

For instance, the structure of the first clamp 701 and the second clamp 702 may be same, or different.

In the embodiment of the present disclosure, as the clamping device 70 includes the first clamp 701 and the second clamp 702, the first clamp 701 and the second clamp 702 can simultaneously open the first cover 501 on the container 50 for holding the liquid to be transferred and the second cover 601 on the target container 60; or the first clamp 701 and the second clamp 702 can simultaneously put the first auxiliary cover 10 on the container 50 for holding the liquid to be transferred and put the second auxiliary cover 20 on the target container 60. In this way, the transfer efficiency of the liquid transfer apparatus can be improved.

The described above are only exemplary embodiments of the present disclosure, and the present disclosure is not intended to be limited thereto. For one of ordinary skill in the art, various changes and alternations may be readily contemplated without departing from the technical scope of the present disclosure, and all of these changes and alternations shall fall within the scope of the present disclosure.

The application claims priority of the Chinese patent application No. 201610487807.1, filed on Jun. 28, 2016 with SIPO and entitled "Liquid Transfer apparatus and Control Method thereof", which is incorporated herein by reference in its entirety.

What is claimed is:

1. A liquid transfer apparatus, comprising: a first auxiliary cover, a second auxiliary cover, a transfer tube, a breathing pipe, a slide rail, a telescopic structure, a driving member, and a clamping device, wherein
   the first auxiliary cover is configured to cover a liquid container for holding a liquid to be transferred, and the second auxiliary cover is configured to cover a target container;
   the transfer tube includes a first end running through the first auxiliary cover, and a second end running through the second auxiliary cover;
   the breathing pipe includes a first end running through the first auxiliary cover, and a second end configured to introduce nitrogen, or an inert gas, so that the liquid in the liquid container is transferred to the target container through the transfer tube;
   the telescopic structure comprises a first end and a second end under the slide rail, the first end of the telescopic structure being disposed on the slide rail and movable over the liquid container and the target container, the second end of the telescope structure is connected with the clamping device;
   the driving member is configured to drive the telescopic structure to move in the slide rail or rotate; and
   the clamping device comprises a first clamp and a second clamp, the first clamp being configured to clamp a first cover of the liquid container or clamp the first auxiliary cover, and the second clamp being configured to clamp a second cover of the target container or clamp the second auxiliary cover.

2. The liquid transfer apparatus according to claim 1, wherein the first clamp is configured to open the first cover of the liquid container and put the first auxiliary cover on the liquid container; and the second clamp is configured to open the second cover of the target container, and put the second auxiliary cover on the target container.

3. The liquid transfer apparatus according to claim 1, wherein both the first clamp and the second clamp comprise a fixed part and a moving part, the fixed part being connected with the moving part, and the moving part being configured to clamp the covers and is configured to be movable on the fixed part.

4. The liquid transfer apparatus according to claim 1, wherein the first auxiliary cover comprises a first auxiliary subpart; and the second auxiliary cover comprises a second auxiliary subpart; and both a part of the first auxiliary subpart, configured to be stretched into the liquid container, and a part of the second auxiliary subpart, configured to be stretched into the target container, are made of an elastic cotton, and the elastic cotton is configured to contact an inner wall of the container.

5. The liquid transfer apparatus according to claim 4, wherein the first auxiliary cover further comprises a first fixing subpart; and the second auxiliary cover further comprises a second fixing subpart;

the inside of the first fixing subpart is provided with threads which are matched with a container mouth of the liquid container; and the first fixing subpart covers the outside of the first auxiliary subpart and is configured to fix the first auxiliary subpart; and the inside of the second fixing subpart is provided with threads which are matched with a container mouth of the target container; and the second fixing subpart covers the outside of the second auxiliary subpart and is configured to fix the second auxiliary subpart.

6. The liquid transfer apparatus according to claim 1, further comprising a valve disposed on the transfer tube and configured to control an on/off of the transfer tube.

7. The liquid transfer apparatus according to claim 1, further comprising a weighing bridge, wherein the target container is placed on the weighing bridge.

8. The liquid transfer apparatus according to claim 1, further comprising a cover placing platform configured to hold covers placed thereon.

9. The liquid transfer apparatus according to claim 1, wherein the liquid to be transferred is an encapsulating adhesive.

10. The liquid transfer apparatus according to claim 1, wherein the telescopic structure is movable up and down, and left and right between the slide rail and the containers.

11. A control method of the liquid transfer apparatus according to claim 1, comprising:

putting the first auxiliary cover on the liquid container and putting the second auxiliary cover on the target container; and introducing nitrogen, or an inert gas, into the breathing pipe, so that the liquid in the liquid container is transferred to the target container through the transfer tube.

12. The control method according to claim 11, further comprising:

utilizing the clamping device to open the first cover of the liquid container, and put the first auxiliary cover on the liquid container; and utilizing the clamping device to open the second cover of the target container, and put the second auxiliary cover on the target container.

13. The control method according to claim 12, further comprising:

the driving member driving the telescopic structure to move to the top of the liquid container, the clamping device clamping the first cover of the liquid container, and the driving member driving the telescopic structure to rotate, to open the first cover of the liquid container; and the driving member driving the clamping device to move to the top of the first auxiliary cover and clamp the first auxiliary cover, and the driving member driving the telescopic structure to move to the top of the liquid container, and driving the telescopic structure to rotate, to put the first auxiliary cover on the liquid container; and the utilizing of the clamping device to open the second cover of the target container, and put the second auxiliary cover on the target container comprises:

the driving member driving the telescopic structure to move to the top of the target container, the clamping device clamping the second cover of the target container, and the driving member driving the telescopic structure to rotate, to open the second cover of the target container; and the driving member driving the clamping device to move to the top of the second auxiliary cover and clamp the second auxiliary cover, and the driving member driving the telescopic structure to move to the top of the target container, and driving the telescopic structure to rotate, to put the second auxiliary cover on the target container.

14. The control method according to claim 12, wherein the utilizing the clamping device to open the first cover of the liquid container, and put the first auxiliary cover on the liquid container, and the utilizing the clamping device to open the second cover of the target container, and put the second auxiliary cover on the target container comprises:

utilizing the first clamp to open the first cover of the liquid container, and put the first auxiliary cover on the liquid container; and utilizing the second clamp to open the second cover of the target container, and put the second auxiliary cover on the target container.

* * * * *